United States Patent
Yi

(10) Patent No.: US 7,910,485 B2
(45) Date of Patent: Mar. 22, 2011

(54) METHOD FOR FORMING CONTACT HOLE USING DRY AND WET ETCHING PROCESSES IN SEMICONDUCTOR DEVICE

(75) Inventor: Hong-Gu Yi, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 640 days.

(21) Appl. No.: 12/001,129

(22) Filed: Dec. 10, 2007

(65) Prior Publication Data
US 2008/0242099 A1 Oct. 2, 2008

(30) Foreign Application Priority Data
Mar. 30, 2007 (KR) .......................... 10-2007-0031992

(51) Int. Cl.
*H01L 21/311* (2006.01)
(52) U.S. Cl. ......... 438/696; 438/700; 438/702; 438/734
(58) Field of Classification Search .................. None
See application file for complete search history.

(56) References Cited

U.S. PATENT DOCUMENTS

| | | | |
|---|---|---|---|
| 6,190,988 B1 * | 2/2001 | Furukawa et al. | 438/386 |
| 6,403,412 B1 * | 6/2002 | Economikos et al. | 438/238 |
| 6,602,794 B1 * | 8/2003 | Kye | 438/725 |

FOREIGN PATENT DOCUMENTS

| | | | |
|---|---|---|---|
| JP | 403280449 A | * | 12/1991 |
| KR | 10-2006-0064273 A | | 6/2006 |

* cited by examiner

*Primary Examiner* — Duy-Vu N Deo
(74) *Attorney, Agent, or Firm* — Blakely, Sokoloff, Taylor & Zafman LLP

(57) ABSTRACT

A method for forming a contact hole in a semiconductor device includes forming an insulation layer over a substrate, forming a hard mask pattern over the insulation layer, forming a first contact hole by partially etching the insulation layer, forming a spacer on sidewalls of the first contact hole, forming a second contact hole to expose the substrate by etching the remaining insulation layer within the first contact hole, forming a third contact hole by horizontally etching the second contact hole, wherein a line width of the third contact hole is wider than that of the first contact hole, and removing the hard mask pattern and the spacer.

10 Claims, 7 Drawing Sheets

METHOD FOR FORMING CONTACT HOLE USING DRY AND WET ETCHING PROCESSES IN SEMICONDUCTOR DEVICE

CROSS-REFERENCE TO RELATED APPLICATIONS

The present invention claims priority of Korean patent application number 2007-0031992, filed on Mar. 30, 2007, which is incorporated by reference in its entirety.

BACKGROUND OF THE INVENTION

The present invention relates to a method for forming a semiconductor device and, more particularly, to a method for forming contact hole in a semiconductor device.

Generally, a contact hole for an electric connection of a lower layer and an upper layer is provided in the semiconductor fabricating method and a plug, a landing plug, a bit line and a storage node are buried in the contact hole. In dynamic random access memory (DRAM) fabricating processes, the contact holes are formed in specific places in a cell region or a peripheral circuit region. Particularly, a bottom critical dimension of a wide contact region which is required to reduce the contact resistance in the cell region is very important.

However, when the develop inspection critical dimension (DICD) is increased in order to secure the bottom CD, the top CD is also increased so that there is a problem in that a bridge is caused by a slight misalignment between an upper contact and a lower contact at the subsequent processes to form another contact.

FIG. 1 is a schematic view illustrating a bridge between a lower contact and an upper contact in a typical semiconductor device. In FIG. 1, a lower contact is a bit line contact and an upper contact is a storage contact. The reference numeral "A" denotes an active region and "SNC" does a storage node contact hole. Also, the reference numeral "BLC" denotes a bit line contact hole.

Referring to FIG. 1, with the increase of the DICD in the formation of a bit line contact hole (BLC), the top CD is also increased. Accordingly, even though a little misalignment is caused when forming a storage node contact hole (SNC) at the subsequent processes, a bridge "B" is generated between the bit line contact and the storage node contact.

Moreover, in the typical method for forming the bit line contact, a buffered oxide etchant (BOE), which is used for a pre-cleaning process before the deposition of a bit line barrier metal layer, makes the top CD be wider so that the generation of the bridge is further increased between the bit line contact and the storage node contact.

SUMMARY OF THE INVENTION

Embodiments of the present invention are directed to providing a method for forming a contact hole capable of increasing a bottom CD and preventing a top CD from being increased.

Embodiments of the present invention are also directed to providing a method for forming a contact hole capable of preventing a top CD from being increased at the time of carrying out subsequent cleaning processes.

In accordance with an aspect of the present invention, there is provided a method for forming a contact hole in a semiconductor device. The method includes forming an insulation layer over a substrate, forming a hard mask pattern over the insulation layer, forming a first contact hole by partially etching the insulation layer, forming a spacer on sidewalls of the first contact hole, forming a second contact hole to expose the substrate by etching the remaining insulation layer within the first contact hole, forming a third contact hole by horizontally etching the second contact hole, wherein a line width of the third contact hole is wider than that of the first contact hole, and removing the hard mask pattern and the spacer.

DESCRIPTION OF SPECIFIC EMBODIMENTS

Embodiments of the present invention relate to a method for forming a contact hole using a dry and a wet etching process in a semiconductor device.

FIGS. 2A to 2F are cross-sectional views of a method for forming a contact hole in accordance with an embodiment of the present invention.

Figure 1:
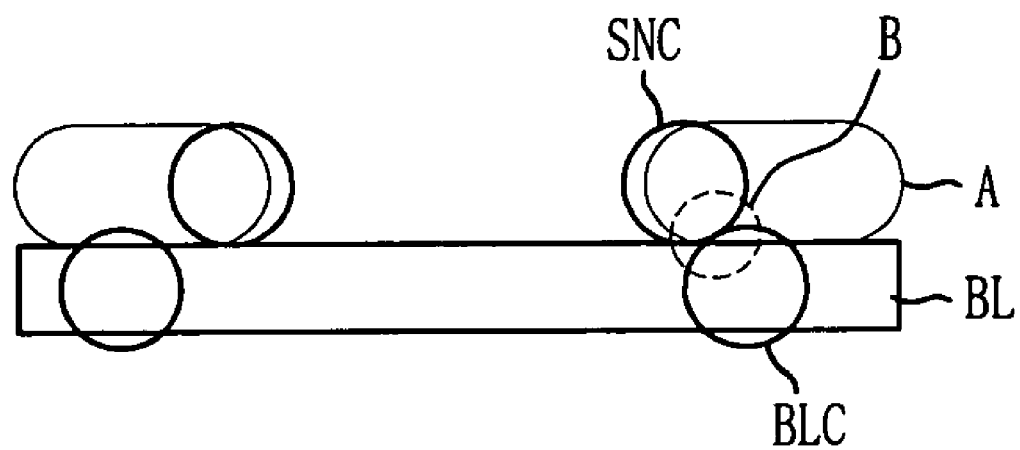
FIG. 1 is a schematic view illustrating a bridge between a lower contact and an upper contact in a typical semiconductor device.
Figure 2A:
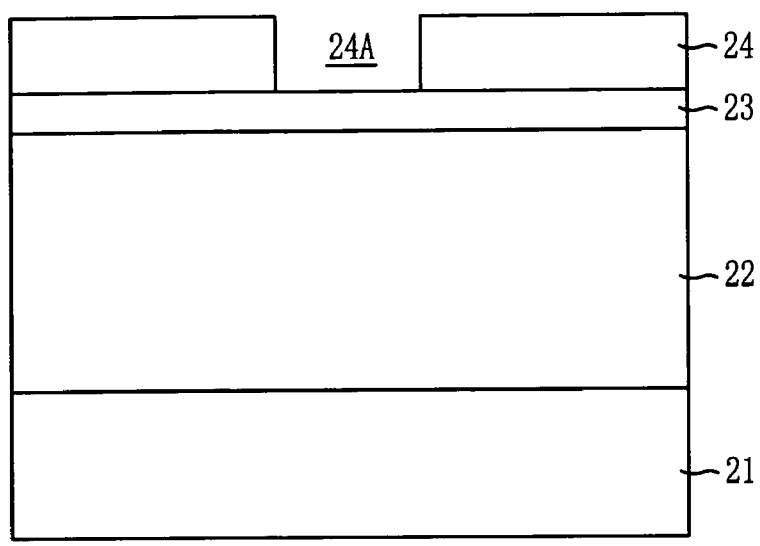
FIGS. 2A to 2F are cross-sectional views of a method for forming a contact hole in accordance with an embodiment of the present invention.

Referring to FIG. 2A, a substrate 21 is prepared. Here, the substrate 21 can be a silicon substrate, a source/drain junction, and a landing plug. Next, after forming an insulation layer 22 over the substrate 21, a hard mask layer 23 is formed over the insulation layer 22. At this time, the insulation layer 22 is an oxide layer and the hard mask layer 23 is a nitride layer. This kind of hard mask layer 23 serves as a mask layer to contribute to make a contact hole pattern without using a photoresist layer at the time of etching the insulation layer 22 in the subsequent process. The hard mask layer 23 is coated with a photoresist layer and patterned by a photo-exposure and a development process to form a contact mask 24. At this time, the contact mask 24 has an opening 24A having a constant line width. This opening is to define the contact hole. Since a bottom line width expanding process is to be performed using a wet chemical, a small-sized DICD can be used in the opening 24A, which will be described later.

Figure 2B:
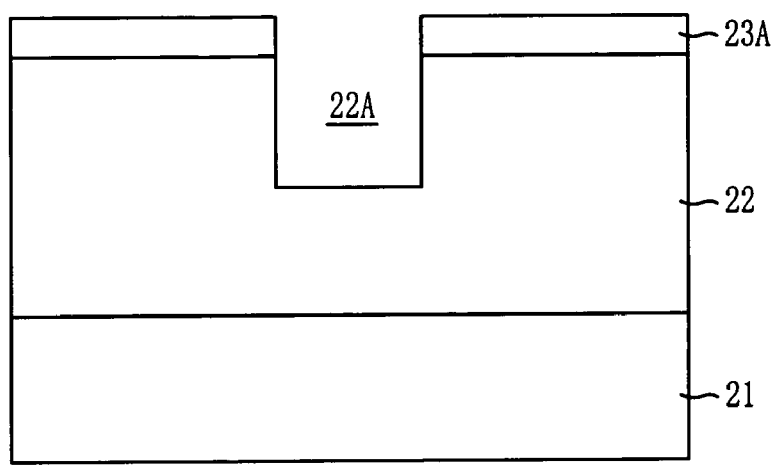

Referring to FIG. 2B, the hard mask layer 23 is etched using the contact mask 24 as an etching mask and the insulation layer 22, which is exposed after etching the hard mask layer 23, is also etched with a predetermined depth. Subsequently, the contact mask 24 is removed. As described above, hard mask patterns 23A are formed by the etching processes and a first contact hole 22A having a certain depth is formed in the insulation layer 22. Particularly, at the time of forming the first contact hole 22A, the insulation layer 22 under the hard mask patterns 23A is not fully etched so that the etch target depth of the insulation layer 22 is controlled at a certain depth (at least a half of the total thickness of the insulation layer 22).

Figure 2C:
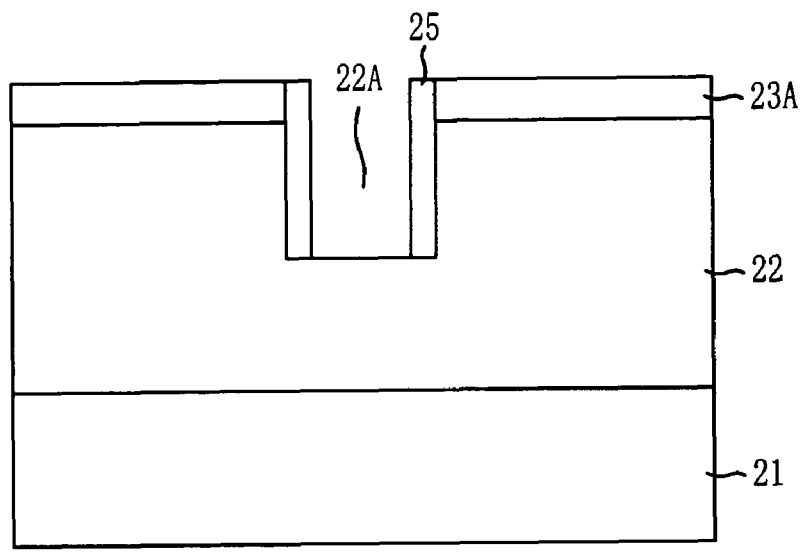

Referring to FIG. 2C, spacers 25 are formed on sidewalls of the first contact hole 22A. At this time, the spacers 25 are formed by depositing a nitride layer on the resultant structure including the first contact hole 22A and then anisotropically etching the nitride layer. Here, this nitride layer etching process is called a spacer etching process and this spacer etching process is carried out by applying a dry etch-back process to the nitride layer. In this anisotropical etching process to form the spacers 25, the nitride layer formed both on a bottom portion of the first contact hole 22A and an upper portion of the hard mask patterns 23A is etched, but the nitride layer formed on the sidewalls of the first contact hole 22A is not etched. The spacers 25 play the role of protecting the top of the contact hole from the wet chemical. Preferably, the insulation layer 22 is the oxide layer and the spacers 25 are the nitride layers. The insulation layer 22 may includes one selected from a borophosphosilicate glass (BPSG), a silicon on demand (SOD) and a tetraethylorthosilicate (TEOS) layers. Preferably, a thermal silicon nitride layer (thermal $Si_3N_4$) can be used as the spacers 25.

Figure 2D:
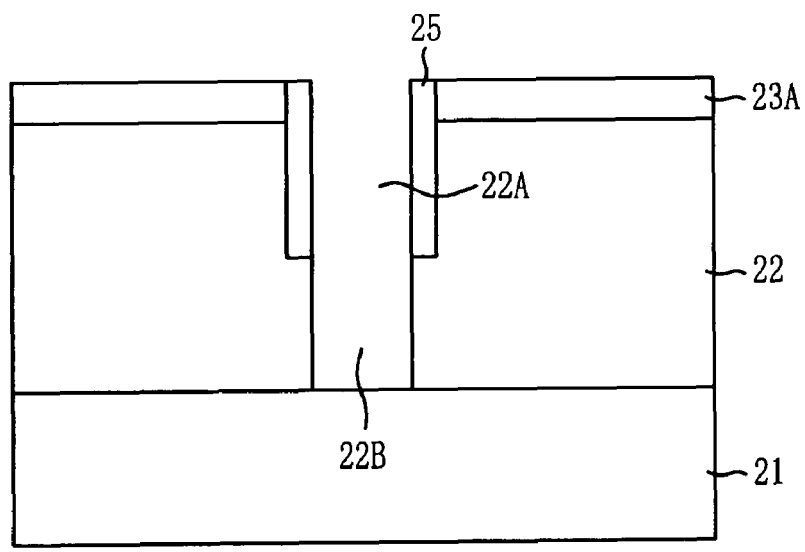

Referring to FIG. 2D, a second contact hole 22B is formed by etching a remaining insulation layer 22 under the first contact hole 22A, thereby exposing a portion of the substrate 21. At this time, when the etching process is performed to form the second contact hole 22B, the hard mask patterns 23A over the upper portion of the insulation layer 22 function as etching barrier layers. Also, a dry etching process is applied to the insulation layer 22 in order to form the first and second contact holes 22A and 22B.

Figure 2E:
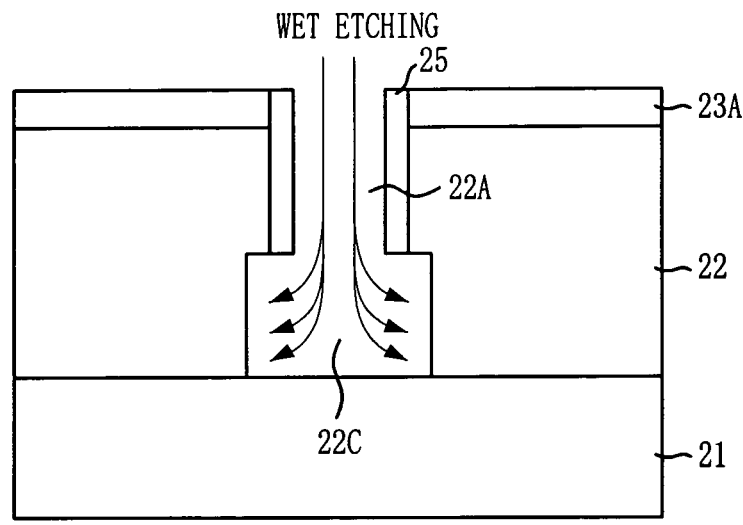

Referring to FIG. 2E, a wet etching process is subsequently carried out within the second contact hole 22B. In the wet etching process, a wet chemical material is used to etch the insulation layer 22. Accordingly, the spacers 25 of the nitride layers and the hard mask patterns 23A are not etched, but only the insulation layer 22 of the oxide layer is selectively etched. Preferably, the wet chemical material used during the wet etching is hydrofluoric acid (HF) or the BOE solution and has a high etching rate relative to the oxide layer. A third contact hole 22C, which is wider than the second contact hole 22B, is formed by applying the wet etching process to the insulation layer 22. That is, the third contact hole 22C has a form in which the sidewalls of the second contact hole 22B are etched and the line width is enlarged. The third contact hole 22C has the same height as the second contact hole 22B but the line width of the third contact hole 22C is bigger than that of the second contact hole 22B. As a result, the line width of the third contact hole 22C is wider than the first contact hole 22A and is deeper than or similar to the first contact hole 22A. Meanwhile, the top portion of the first contact hole 22A is covered with the capping layer of the hard mask patterns 23A and the sidewalls of the first contact hole 22A is covered with the capping layer of the spacers 25. Accordingly, the increase of the line width of the first contact hole 22A is not caused in the above-mentioned wet etching process.

Figure 2F:
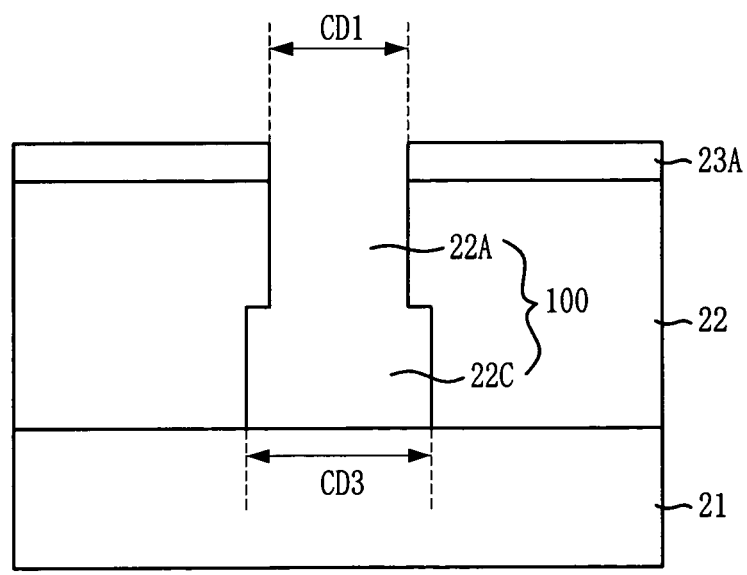

Referring to FIG. 2F, the hard mask patterns 23A and the spacers 25 are removed. At this time, since the hard mask patterns 23A and the spacers 25 are the nitride layers, they can be selectively removed without the loss of the insulation layer 22. For example, the wet etching process using the phosphoric acid or the dry etching process using a carbon/fluorine-based gas (for example, $CF_4$) can be conducted. After removing the hard mask patterns 23A and the spacers 25, a contact hole 100 which is made of the first contact hole 22A and the third contact hole 22C is finally formed. Since the line width (CD3) of the third contact hole 22C is wider than the line width (CD1) of the first contact hole 22A, the bottom width of the contact hole 100 is wider than the top width thereof. A contact resistance can be reduced due to the wider bottom width. Also, considering the line width of the first contact hole 22A, there are no attacks and increase of the line width at the top portion of the contact hole 100.

FIGS. 3A to 3F are cross-sectional views of a method for forming a contact hole in accordance with another embodiment of the present invention.

Figure 3A:
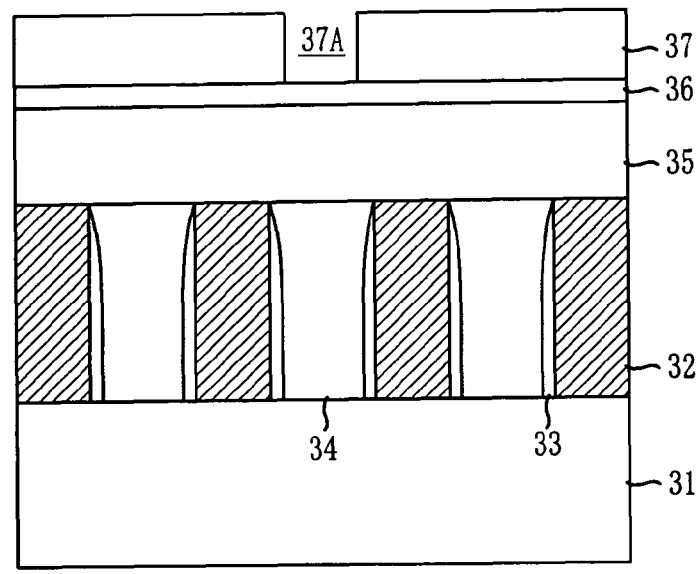
FIGS. 3A to 3F are cross-sectional views of a method for forming a contact hole in accordance with another embodiment of the present invention.

Referring to FIG. 3A, a plurality of gate patterns 32 are formed over a substrate 31. Each of the gate patterns 32 includes a gate insulation layer, a gate electrode and a gate hard mask layer (not shown, typically disposed on the gate electrode). Gate spacers 33 are formed on the sidewalls of the gate patterns 32. The substrate 31 is a silicon substrate, including a cell region and a peripheral circuit region. In another embodiment of the present invention, it is assumed that the substrate 31 is in the cell region. Subsequently, landing plugs 34 are formed between the gate patterns 32 over the substrate 31. At this time, the landing plugs 34 are polysilicon layers. After an insulation layer 35 is formed over the resultant structure, a hard mask layer 36 is formed over the insulation layer 35. The insulation layer 35 is an oxide layer and the hard mask layer 36 is a nitride layer. This kind of the hard mask layer 36 serves as an etching mask layer to contribute to make a contact hole pattern without using a photoresist layer at the time of etching the insulation layer 35 in the subsequent process. Subsequently, the hard mask layer 36 is coated with a photoresist layer and patterned by a photo-exposure and a development process to form a bit line contact mask 37. At this time, the bit line contact mask 37 has an opening 37A having a constant line width. This opening is to define the contact hole. Similar to one embodiment of the present invention, since a bottom line width expanding process is to be performed using a wet chemical, a small-sized DICD can be used in the opening 24A.

Figure 3B:
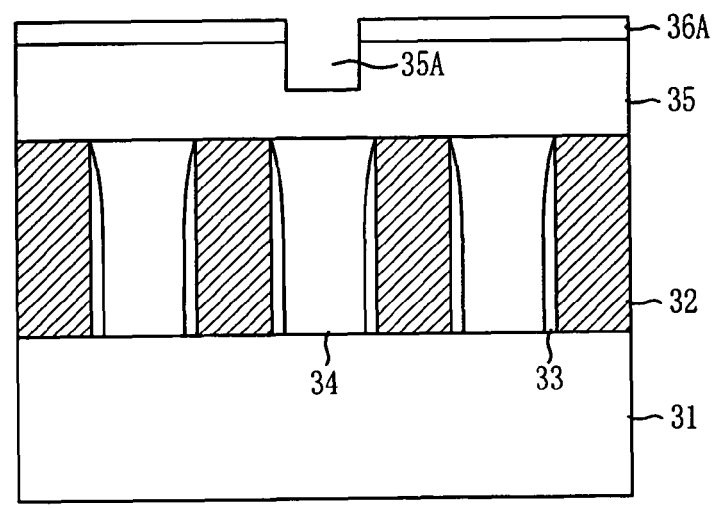

Referring to FIG. 3B, the hard mask layer 36 is etched using the bit line contact mask 37 as an etching mask and the insulation layer 35, which is exposed after etching the hard mask layer 36, is also etched to a certain depth. Subsequently, the bit line contact mask 37 is removed. As described above, hard mask patterns 36A are formed by the etching processes and a first contact hole 35A having a certain depth is formed in the insulation layer 35. Particularly, at the time of forming the first contact hole 35A, the insulation layer 35 under the hard mask patterns 36A is not fully etched so that the target etching depth of the insulation layer 35 is controlled at a certain depth (at least a half of the total thickness of the insulation layer 35.

Figure 3C:
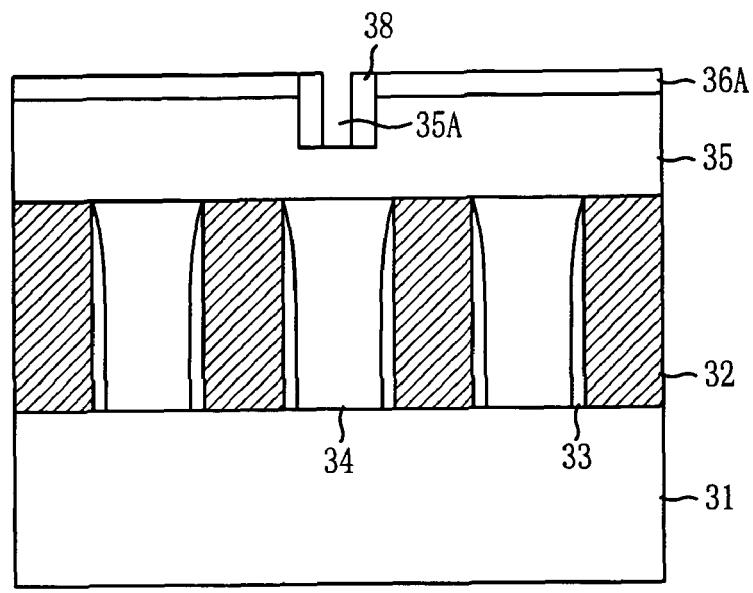

Referring to FIG. 3C, spacers 38 are formed on sidewalls of the first contact hole 35A. At this time, the spacers 38 are formed by depositing a nitride layer over the resultant structure including the first contact hole 35A and then anisotropically etching the nitride layer. Here, this nitride layer etching process is called a spacer etching process and this spacer etching process is carried out by applying a dry etch-back process to the nitride layer. In this anisotropical etching process to from the spacers 38, the nitride layer formed both on a bottom portion of the first contact hole 35A and an upper portion of the hard mask patterns 36A is etched, but the nitride layer formed on the sidewalls of the first contact hole 35A is not etched. The spacers 38 function as passivation layers to prevent the insulation layer 35 from a wet etching process to form the bit line contact hole. Preferably, the insulation layer 35 is the oxide layer and the spacers 38 are the nitride layers. Preferably, the thermal silicon nitride layer (thermal $Si_3N_4$) can be used as the spacers 38.

Figure 3D:
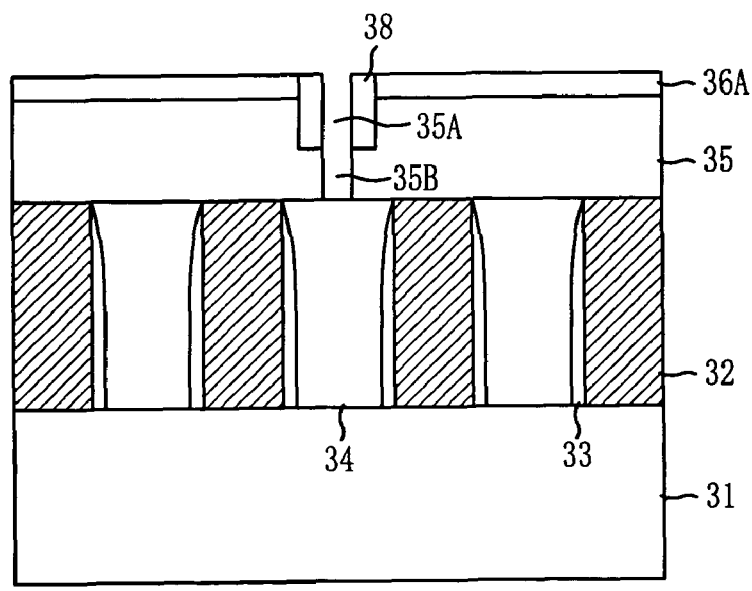

Referring to FIG. 3D, a second contact hole 35B is formed by etching a remaining insulation layer 35 under the first contact hole 35A, thereby exposing a portion of each of the landing plugs 34. At this time, when the etching process is performed to form the second contact hole 35B, the hard mask patterns 36A on the upper portion of the insulation layer 35 function as etching barrier layers. Also, a dry etching process is applied to the insulation layer 35 in order to form the first and second contact holes 35A and 35B. At the time of forming the second contact hole 35B, a self-aligned contact (SAC) failure can be caused while the gate hard mask layer exposed from the second contact hole 35B partially undergoes attacks from the etching process. However, in another embodiment of the present invention, since the overlap of the gate hard mask layer and the DICD of the bit line contact mask to form the first contact hole 35A is very small, this overlap does not cause a problem of a misalignment.

Figure 3E:
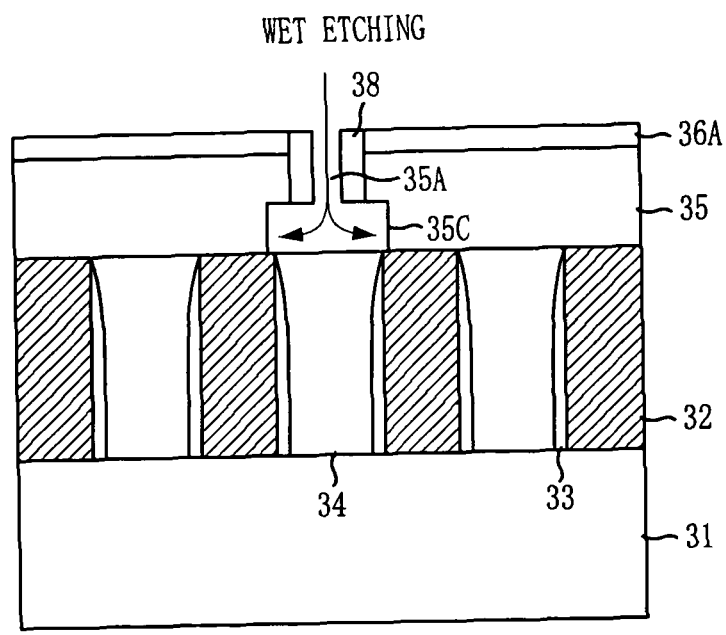

Referring to FIG. 3E, a wet etching process is subsequently carried out within the second contact hole 35B. In the wet etching process, a wet chemical material is used to etch the insulation layer. Accordingly, the spacers 38 of the nitride layers and the hard mask patterns 36A are not etched, but only the insulation layer 35 of the oxide layer is selectively etched. Preferably, the wet chemical material used during the wet etching is HF or the BOE solution. The insulation layer 35 providing the second contact hole 35B is wet-etched by the above-described wet etching process and the third contact hole 35C is formed with a wider line width. That is, the line width of the third contact hole 35C is formed by horizontally extending the line with of the second contact hole 35B. Although the second and third contact holes 35B and 35C have the same depth, the depth of the third contact hole 35C is wider than that of the second contact hole 35B. Also, the line width of the third contact hole 35C is wider than that of the first contact hole 35A and the depth of the third contact hole 35C is deeper than or similar to that of the first contact hole 35A. Meanwhile, the top portion of the first contact hole 35A is covered with the capping layer of the hard mask patterns 36A and the sidewalls of the first contact hole 35A is covered with the capping layer of the spacers 38. Accordingly, the increase of the line width of the first contact hole 22A is not caused in the above-mentioned wet etching process.

Figure 3F:
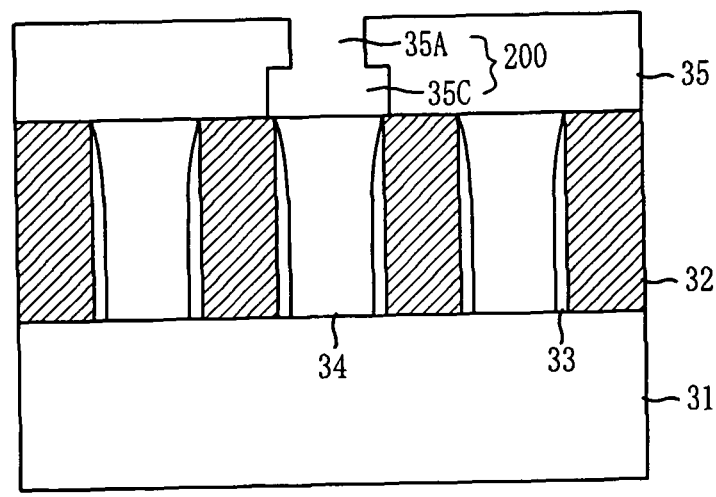

Referring to FIG. 3F, the hard mask patterns 36A and the spacers 38 are removed. At this time, since the hard mask patterns 36A and the spacers 38 are the nitride layers, they can be selectively remove without the loss of the insulation layer 35. For example, the wet etching process using a phosphoric acid or a dry etching process using a carbon/fluorine-based gas (for example, $CF_4$) can be conducted. After removing the hard mask patterns 36A and the spacers 38, a contact hole 200 which is made of the first contact hole 35A and the third contact hole 35C is finally formed. Since the line width of the third contact hole 35C is wider than that of the first contact hole 35A, the bottom width of the contact hole 200 is wider than the top width thereof. A contact resistance can be reduced due to the wider bottom width. Also, considering the line width of the first contact hole 35A, there are no attacks and increase of the line width at the top portion of the contact hole 200.

According to another embodiment of the present invention, the bit line contact hole 200 has a wider bottom line width without the increase of the top line width so that a contact resistance can be reduced and a bridge with the storage node contact hole can be prevented in the subsequent processes.

As apparent from the above, the present invention can reduce the contact resistance while the line width of the top portion of the contact hole is maintained. Also, the yield of the SAC can be improved by guaranteeing a processing margin against the misalignment for the storage node contact hole.

While the present invention has been described with respect to the specific embodiments, the above embodiments of the present invention are illustrative and not limitative. It will be apparent to those skilled in the art that various changes and modifications may be made without departing from the spirit and scope of the invention as defined in the following claims.

What is claimed is:

1. A method for forming a contact hole in a semiconductor device, the method comprising:
    forming a plurality of gate patterns over a substrate;
    forming a plurality of landing plugs between the gate patterns;
    forming an insulation layer over the substrate including the landing plugs;
    forming a hard mask layer over the insulation layer;
    forming a bit line contact mask over the hard mask layer;
    forming a hard mask pattern by etching the hard mask layer using the bit line contact mask;
    forming a first contact hole by partially etching the insulation layer using the hard mask pattern;
    forming a spacer on sidewalls of the first contact hole;
    forming a second contact hole to expose a surface of the landing plugs by etching the remaining insulation layer within the first contact hole;
    forming a third contact hole by horizontally etching the second contact hole, wherein a line width of the third contact hole is wider than that of the first contact hole; and
    removing the hard mask pattern and the spacer to form a bit line contact hole including the first and third contact holes,
    wherein the bit line contact mask is formed to have a small-sized develop inspection critical dimension (DICD) so as to prevent an overlap between the gate patterns and the second contact hole.

2. The method of claim 1, wherein the hard mask pattern and the spacer are materials which have a selectivity ratio between a dry etching process and a wet etching process of the insulation layer.

3. The method of claim 1, wherein the insulation layer is an oxide layer and wherein the hard mask pattern and spacer are nitride layers.

4. The method of claim 1, wherein the insulation layer may include one selected from a borophosphosilicate glass (BPSG), a silicon on demand (SOD) and a tetraethylorthosilicate (TEOS).

5. The method of claim 1, wherein the spacer is formed by depositing a nitride layer and etching back the deposited nitride.

6. The method of claim 5, wherein the nitride layer is a thermal silicon nitride layer (thermal $Si_3N_4$).

7. The method of claim 1, wherein forming the third contact hole is carried out by a wet etching process.

8. The method of claim 7, wherein the wet etching process uses a wet etching chemical which has a high etching rate relative to an oxide layer.

9. The method of claim 8, wherein the wet etching chemical is a hydrofluoric acid (HF) solution or a buffered oxide etchant (BOE) solution.

10. The method of claim 1, wherein the bit line contact mask is a photoresist pattern and wherein the photoresist pattern undergoes a reflow process.

* * * * *